United States Patent [19]
Yoo et al.

[11] Patent Number: 6,049,127
[45] Date of Patent: Apr. 11, 2000

[54] HERMETICALLY SEALED TUNGSTEN-COPPER COMPOSITE PACKAGE CONTAINER FOR PACKAGING OF MICROWAVE DEVICES

[75] Inventors: Myoung Ki Yoo, Koyang; Jong Ku Park, Namyangjoo; Kyung Tae Hong, Seoul; Young Do Kim, Seoul; Seung Ick Lee, Seoul; Seung Woo Lee, Seoul; Ju Choi, Seoul, all of Rep. of Korea

[73] Assignee: Korea Institute of Science and Technology, Seoul, Rep. of Korea

[21] Appl. No.: 09/096,740

[22] Filed: Jun. 12, 1998

[30] Foreign Application Priority Data

Jun. 14, 1997 [KR] Rep. of Korea ................... 97/24735

[51] Int. Cl.$^7$ ................................................. H01L 23/34
[52] U.S. Cl. ........................................ 257/728; 357/704
[58] Field of Search ................................ 257/728, 777, 257/704, 701, 703, 709

[56] References Cited

U.S. PATENT DOCUMENTS

| | | |
|---|---|---|
| 3,936,864 | 2/1976 | Benjamin . |
| 4,150,393 | 4/1979 | Wilson et al. . |
| 4,649,416 | 3/1987 | Borkowski et al. . |
| 4,672,151 | 6/1987 | Yamamura . |
| 4,942,076 | 7/1990 | Panicker et al. . |
| 4,988,386 | 1/1991 | Qenning et al. . |
| 5,563,101 | 10/1996 | Osada et al. . |
| 5,574,959 | 11/1996 | Tsujioka et al. . |

OTHER PUBLICATIONS

N.M. Parikh, et al., "Cermets: II, Wettability and Microstructure Studies in Liquid–Phase Sintering", Journal of the American Ceramic Society, vol. 40, No. 9, pp. 315–320 (1957).

W.J. Huppmann, et al., "Modelling of Rearrangement Processes in Liquid Phase Sintering", Acta Metallurgia, vol. 23, pp. 965–971 (1975).

N.K. Prokushev, et al., "Kinetics of Densification and Growth of Refractory Phase Grains in the Liquid–Phase Sintering of Very Finely Divided Tungsten–Copper Materials", Soviet Powder Metallurgy and Metal Ceramics, Translated from Poroshkovaya Metallurgiya, No. 9, pp. 30–37 (1986).

R.M. German, "Theory of Thermal Deginding", The International Journal of Powder Metallurgy, vol. 23, No. 4, pp. 237–245 (1987).

T.–S. Wei, et al., "Injection of Molded Tungsten Heavy Alloy", The International Journal of Powder Metallurgy, vol. 24, No. 4, pp. 327–335 (1988).

C. Williams, et al., "Design Considerations for Microwave Packages", Ceramic Bulletin, vol. 70, pp. 714–721 (1991).

J.C. Moller, et al., "Constitutive Behavior of a Powder/Binder System: Molding and Thermal Debinding", The International Journal of Powder Metallurgy, vol. 30, No. 1, pp. 103–114 (1994).

(List continued on next page.)

*Primary Examiner*—Carl Whitehead, Jr.
*Assistant Examiner*—Roy Potter
*Attorney, Agent, or Firm*—Scully, Scott, Murphy & Presser

[57] ABSTRACT

A method for fabricating a hermetically sealed tungsten-copper package container for a microwave device is provided with the steps of forming an injection feedstock by mixing a polymer binder with a tungsten powder having a particle diameter of 2 to 5 $\mu$m and a purity 99.9 of weight percent, forming a three-dimensional part by applying a powder injection molding to the feedstock, obtaining a tungsten skeleton structure by eliminating the binder from the injection molded part, and carrying out a copper infiltration to a copper plate placed on the tungsten skeleton structure for two hours under a hydrogen atmosphere at a temperature of 1250° C. The method incorporates an improved heat sink characteristic, a thermal expansion coefficient similar to that of GaAs, and a capability of applying thereto a strip wire connection, without an extra machining process.

7 Claims, 6 Drawing Sheets

OTHER PUBLICATIONS

S.-K. Joo, et al., "Effect of Cobalt Addition on the Liquid-Phase Sintering of W–Cu Prepared by the Fluidized Bed Reduction Method", Metallurgical and Materials Transactions A, vol. 25A, pp. 1575–1578 (1994).

J.L. Johnson, et al., "W–Cu and Mo–Cu for Microelectric Packaging Applications: Processing Fundamentals", Tungsten and Refractory Metals–1994, Proceedings, Ed. A. Bose and R.J. Dowding, MPIF, Princeton, NJ, pp. 245–252 (1995).

B. Yang, "Study on Powder Injection Molding Ball Milled W–Cu Powders", ibid, pp. 237–244.

J.L. Johnson, et al., "Chemically Activated Liquid Phase Sintering of Tungsten–Copper", The International Journal of Powder Metallurgy, vol. 30, No. 1, pp. 91–102 (1994).

HERMETICALLY SEALED TUNGSTEN-COPPER COMPOSITE PACKAGE CONTAINER FOR PACKAGING OF MICROWAVE DEVICES

BACKGROUND OF THE INVENTION

1. Field of the Invention

The present invention relates to a hermetically sealed package container which employs a tungsten-copper composite having a high-level thermal conductivity and thermal expansion coefficient similar to those of semiconductor devices such as GaAs-FET (gallium arsenide field effect transistor), and GaAs MMIC (monolithic microwave integrated circuit) which are applied to low noise high frequency amplifying devices operating in the order of a GHz frequency band, for thereby preventing the aforementioned devices from being influenced by external environmental factors such as electromagnetic fields and moistures, and to a fabrication method thereof.

2. Description of the Prior Art

In recent years, along with rapid developments in wireless communication technology ranging from mobile telephone communication to artificial satellite communication, there has been an increasing demand for high frequency devices which can operate in frequency bands of single digit GHz to double digit GHz.

A GaAs compound semiconductor having a higher electron mobility in comparison to an Si semiconductor, can be directly attached onto a heat sink substrate due to the electronically nonconductive characteristic of the substrate itself. However, a disadvantage with the GaAs compound semiconductor is its low rupture strength. In order for the GaAs semiconductor to be employed as a microwave device, container packaging design must be carried out under a concept different from that of the Si semiconductor. Such a package structure is provided with a space for safely accommodating a semiconductor device in a desired portion therein, a circuit formed therein, and an air-tight lid for hermetically sealing the package.

A ceramic package has been widely employed for high power and high frequency devices. However, where alumina is used as an insulating ceramic, multi-layer package is necessary in order to fabricate a circuit, a sintering temperature for shaping thereof is high, and of which surface is plated with conductive metals material, as disclosed in U.S. Pat. Nos. 3,936,864/4,150,393/4,649,416.

Also, due to a frequency oscillation effect being induced resulting from a ring-shaped metallic layer provided in an upper portion of a ceramic container which is used to seal the container's lid, a valid frequency band tends to be disadvantageously narrow.

Although a metallic container may easily overcome such a disadvantage, input/output terminals are still difficult to introduce through the container because they must be insulated from and remain perpendicular to the walls thereof. Further, the container must be machined as disclosed in U.S. Pat. No. 4,672,151, thereby reducing productivity and increasing cost.

The microwave device provided in the container emits heat when power is supplied thereto. For an optimal operation of the device, the container substrate that receives the device thereon should be made of material with a sufficient thermal conductivity, for efficiently dissipating away the heat from the device and preventing the device from falling in the container. Additionally, thermal expansion coefficient of the container substrate should be similar to that of a semiconductor substrate to cyclic prevent stress build-up due to heating.

A tungsten-copper composite material is known to have similar characteristics to a GaAs FET, and a GaAs MMIC for microwave devices, as disclosed in U.S. Pat. Nos. 4,942,076/4,988,386/5,563,101. This is because the tungsten-copper composite as a package material provides good thermal conductivity due to evenly dispersed copper matrix having a high thermal conductivity through a tungsten skeleton that has a low thermal conductivity, and at the same time the thermal expansion coefficient of tungsten-copper composite is similar to that of GaAs.

SUMMARY OF THE INVENTION

Therefore, it is an object of the present invention to provide a hermetically sealed tungsten-copper composite package container and method for fabricating the same without carrying out an extra machining process, for thereby hermetically sealing high power microwave amplifying devices such as GaAs FET and GaAs MMIC and improving a heat sink characteristic by use of a powder injection molding.

To achieve the above-described object, a hermetically sealed tungsten-copper composite package container for a microwave device according to the present invention is provided with a hermetically sealed package body including a base plate, an inner plate provided on the base plate for receiving thereon a microwave device, and a plurality of side walls respectively having a plurality of openings for each passing therethrough an external connection so as to electrically connect the microwave device to an external system, wherein the base plate, the inner plate and the plurality of side walls are incorporated into a single tungsten-copper composite body pattern, a plurality of first insulating materials formed higher than the inner plate for receiving thereon the microwave device between the inner plate and the respective side walls, a container lid formed of a tungsten-copper composite material for covering the package container body, and a plurality of second insulating materials formed extending from a lower surface of the container lid and for being inserted into corresponding ones of the plurality of openings, whereby the microwave device is mounted on the inner plate, the external connection is connected through a corresponding one of the via holes to the microwave device, and the second insulating materials formed on the container lid are inserted into corresponding ones of the plurality of openings for thereby electrically insulating the external connection from the package body.

Further, to achieve the above-described object, a hermetically sealed tungsten-copper composite package container for a microwave device according to the present invention is provided with a hermetically sealed package body including a base plate, an inner plate formed on the base plate for receiving thereon a microwave device, and a plurality of side walls respectively having a plurality of via holes for each passing therethrough an external connection so as to electrically connect the microwave device to an external system, wherein the base plate, the inner plate and the plurality of side walls are incorporated into a tungsten-copper composite single body pattern, a plurality of insulating materials for electrically insulating the package body from an external connection that passes through each of the plurality of via holes by filling the respective via holes through each of which passes the external connection, and a container lid formed of a tungsten-copper composite material for covering the package container body, whereby the microwave device is mounted on the inner plate, and the external connection is connected through a corresponding one of the via holes to the microwave device.

Also, to achieve the above-described object, a method for fabricating a hermetically sealed tungsten-copper composite package container for a microwave device according to the present invention is provided with the steps of forming an injection feedstock by mixing a polymer binder with a tungsten powder having a particle diameter of 2 to 5 μm and a purity 99.9 percent, forming a three-dimensional mold by applying a powder injection molding to the feedstock, obtaining a tungsten skeleton structure by eliminating the binder from the injection molding, and carrying out a copper infiltration to a copper plate placed on the tungsten skeleton structure for two hours under a hydrogen atmosphere at a temperature of 1250° C.

Referring to characteristics of the invention as described above, the hermetically sealed tungsten-copper composite package container for a microwave device according to the present invention improves a heat sink characteristic and is similar to GaAs in thermal expansion coefficient.

Further, because the composite material container is fabricated in a three-dimension by use of a powder injection molding, the container can be easily fabricated without an extra machining process.

Still further, a height of an opening is maintained substantially identical to that of the upper surface of the microwave device mounted on the inner plate for minimizing the length of a wire being employed to be connected to an external system, whereby a wire length can be significantly decreased compared to a conventional case in which a gold alloy wire and a gold alloy bump are adopted so as to reduce a resistance and enable a strip wire connection.

DETAILED DESCRIPTION OF THE INVENTION

The hermetically sealed tungsten-copper composite package container according to the present invention and the fabrication method thereof will be described by way of the following examples.

EXAMPLE 1

In order to carry out a powder injection molding, an injection feedstock was prepared by mixing tungsten powder having a purity of 99.97%, an average particle size ranging from 2 to 5 microns, with a polymer binder formed by combining paraffin wax, polyethylene and stearic acid. The solid loading of source powder in the feedstock was 55%. As a packaging container for a microwave device, the shaped body which would form the container body and lid as shown in FIG. 1 was fabricated by a high pressure injection of the prepared feedstock into an injection mold cavity.

A portion of the binder in the injected parts was then eliminated by solvent extraction using an n-heptane solution. The binder remaining after the solvent extraction was subsequently eliminated entirely by a thermal decomposition. The relative density (=[sinter density/19.3]×100) of the binder-eliminated parts was 55%, corresponding to the solid loading. The thusly fabricated parts for forming the container body and lid of FIG. 1 were sintered for 20 hours under a hydrogen atmosphere at a temperature of 1500° C. to have a porosity of 25% (75% of relative sinter density).

Figure 1:
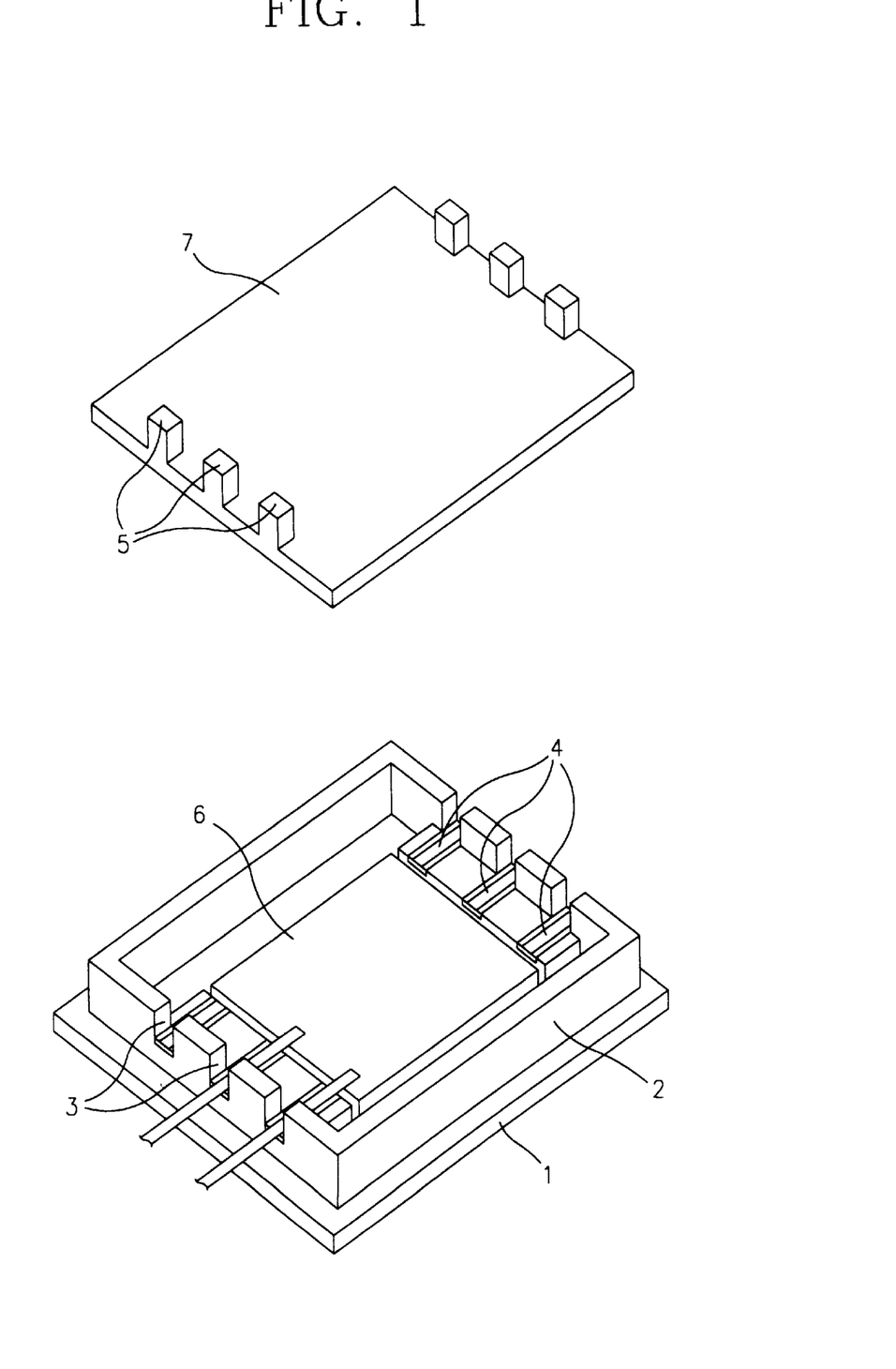
FIG. 1 is an exploded perspective view illustrating an embodiment of a package body and a container lid for a hermetically sealed tungsten-copper composite package container according to the present invention.

In order to form the sintered body of FIG. 1 having a porosity of 25%, an cut-off oxygen-free copper plate obtaining 3% more than the copper amount (approximately 15% of weight ratio) that is required to fill the entire pores, was infiltrated for two hours under an hydrogen atmosphere at a temperature of 1250° C. by placing the same on the upper surface of the base plate 1, for thereby becoming a tungsten-copper composite material.

The volume of the infiltrated container as shown in FIG. 1 was measured to be 16.5 cm³, thereby confirming that a theoretical amount of copper had infiltrated into the pores. The copper left over after infiltrating into the sintered body is evenly distributed on the base plate 1.

As shown in FIG. 1, an inner plate 6 for receiving thereon a microwave device, side walls 2 and a base plate 1 are incorporated into a single pattern body. A plurality of openings 3 are provided in the side walls 2 to insulate the body from an external circuit connection. At the same time, when the body is combined with a container lid 7 to form a hermetically sealed package, there are also provided external circuit connecting terminals, thereby maintaining an air-tight seal around the connection portion thereof. Also, a first insulating material is formed between the side walls 2 having the openings 3 therethrough and the inner plate 6 for receiving a microwave device thereon so as to be higher than the inner plate 6. In particular, the height of the first insulating material 4 is appropriate to horizontally connecting an external connection from the microwave device to an exterior thereof, for thereby decreasing the length of the wire connection and enabling a strip wire connection.

EXAMPLE 2

Figure 2:
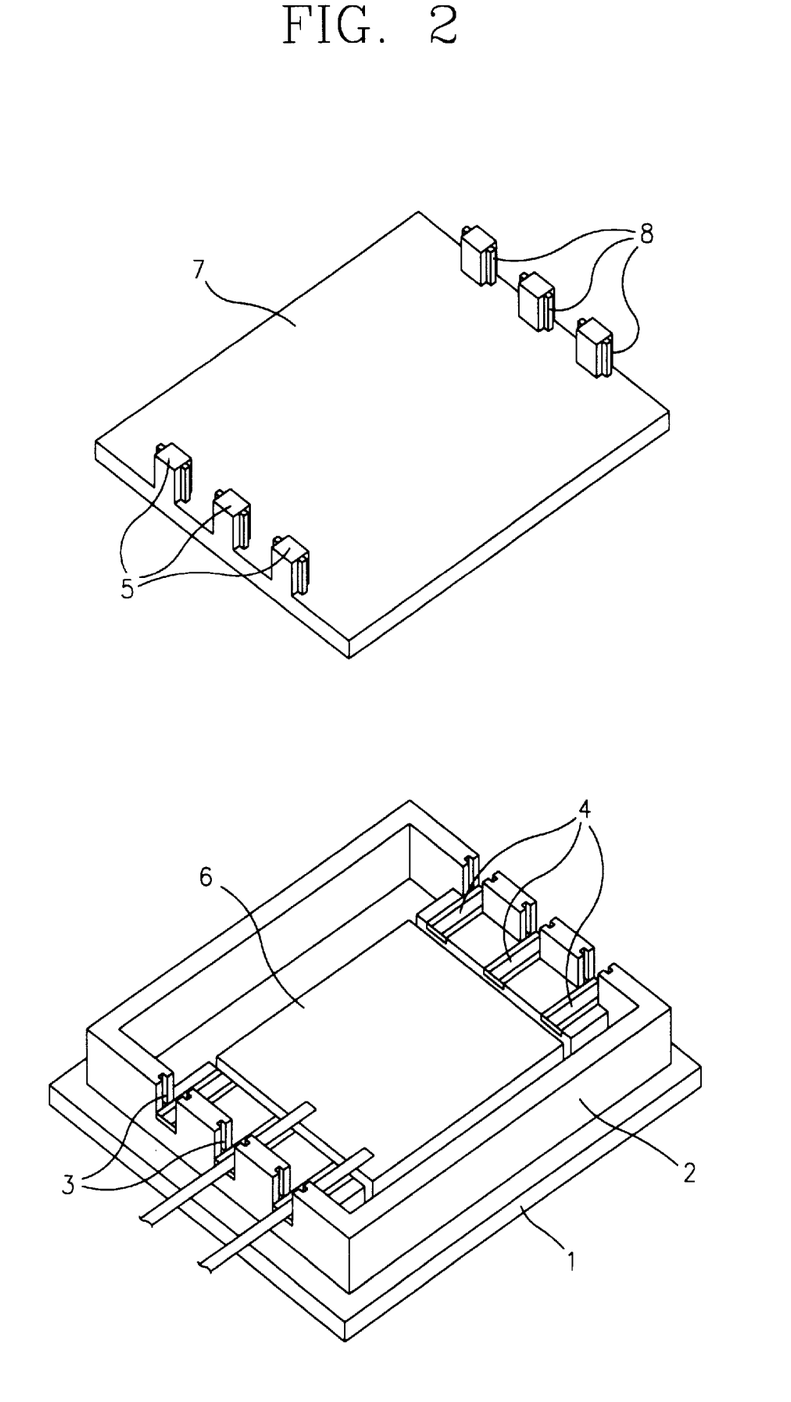
FIG. 2 is an exploded perspective view another embodiment of a package body and a container lid for illustrating a hermetically sealed tungsten-copper composite package container according to the present invention.
Figure 3:
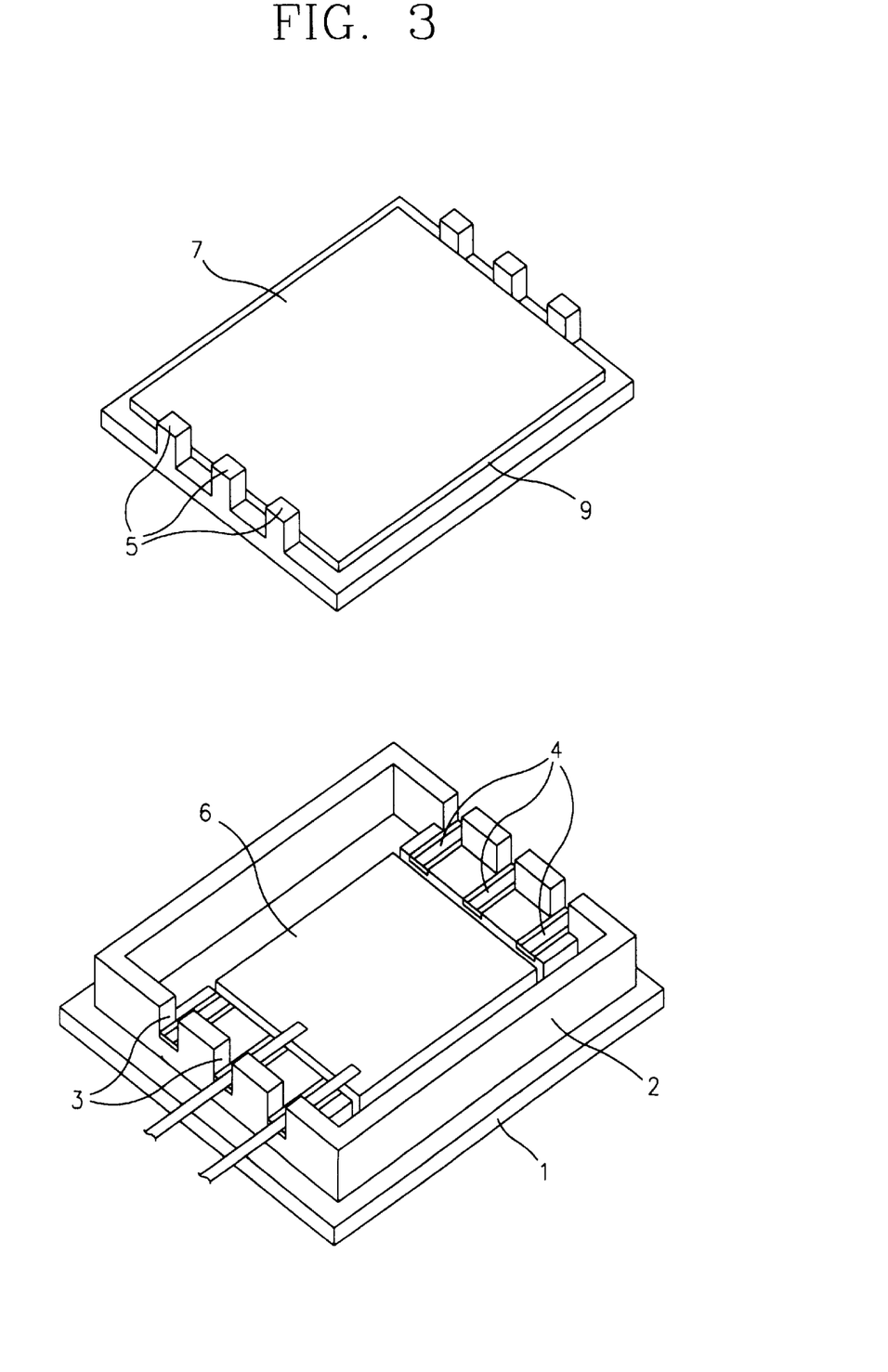
FIG. 3 is an exploded perspective view further embodiment of a package body and a container lid for illustrating a hermetically sealed tungsten-copper composite package container according to the present invention.
Figure 4:
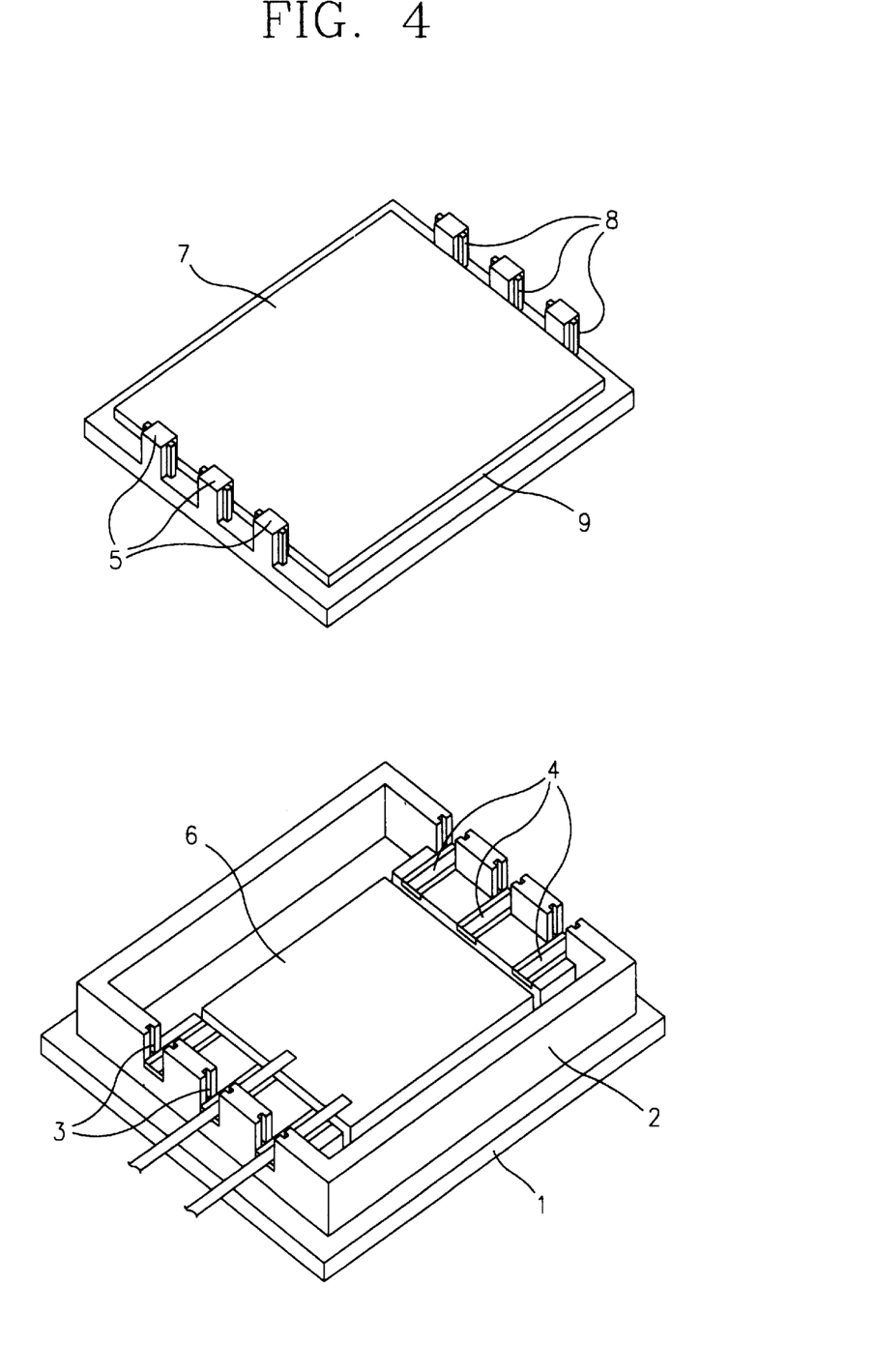
FIG. 4 is an exploded perspective view another embodiment of a package body and a container lid for illustrating a hermetically sealed tungsten-copper composite package container according to the present invention.

The feedstock fabricated in Example 1 is formed by an injection molding and molded into shapes as shown in FIGS. 2 through 4, so as to have a porosity of 25%, and a sintering is carried out for 20 hours under a hydrogen atmosphere at a temperature of 1500° C. Then, copper as in Example 1 is infiltrated for 2 hours under a hydrogen atmosphere at a temperature of 1250° C. so as to fabricate a tungsten-copper composite container for a microwave device. In order to prevent the container and the container lid from repositioning during the fixture, a preferred embodiment of the present invention (FIG. 2) provides a slide protect 8 of the second insulation material 5 on a corresponding portion along which is fixed on the container lid or an inner lid on a lower surface of the container lid, for respectively serving as a slide protect 9 (FIG. 3).

EXAMPLE 3

Figure 5:
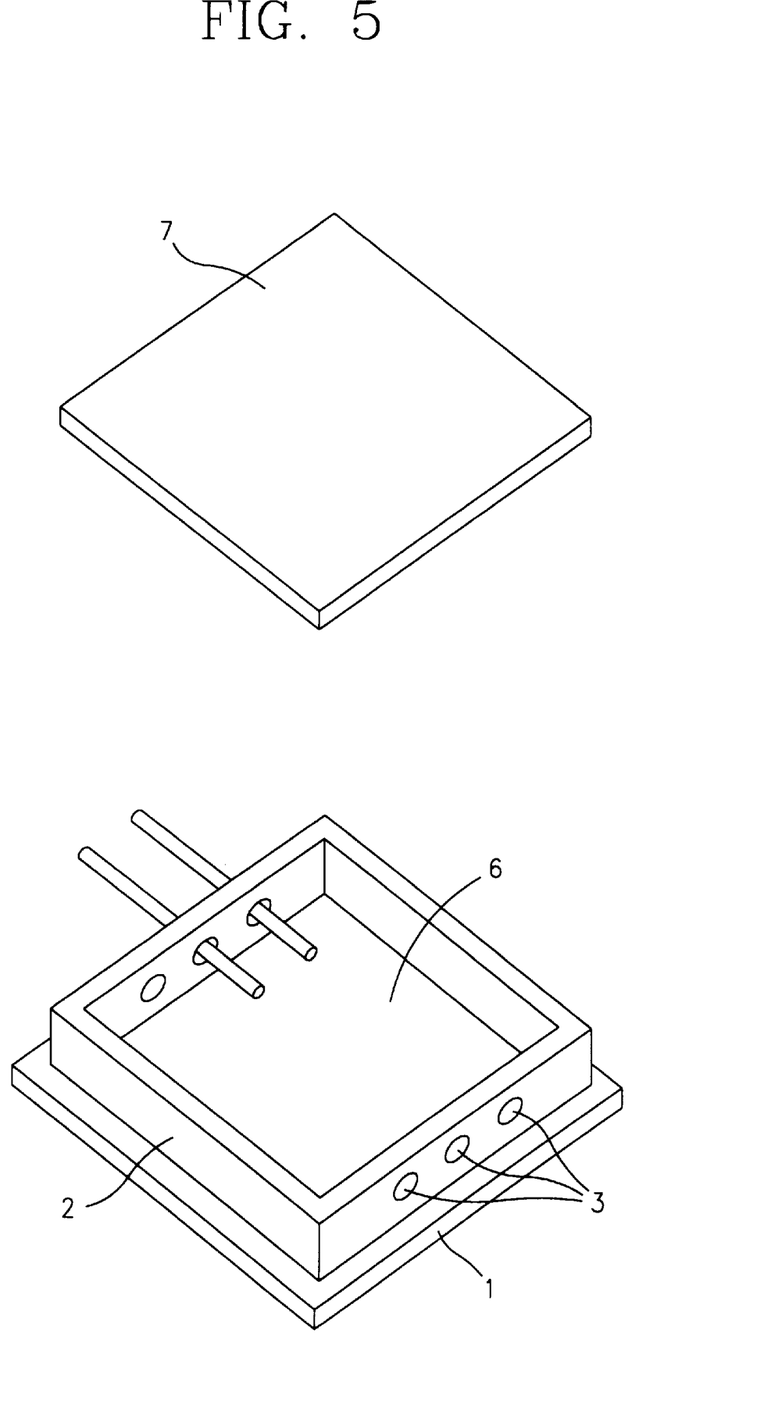
FIG. 5 is a perspective view illustrating a still further embodiment of a package body and a container lid for a hermetically sealed tungsten-copper composite package container according to the present invention.
Figure 6:
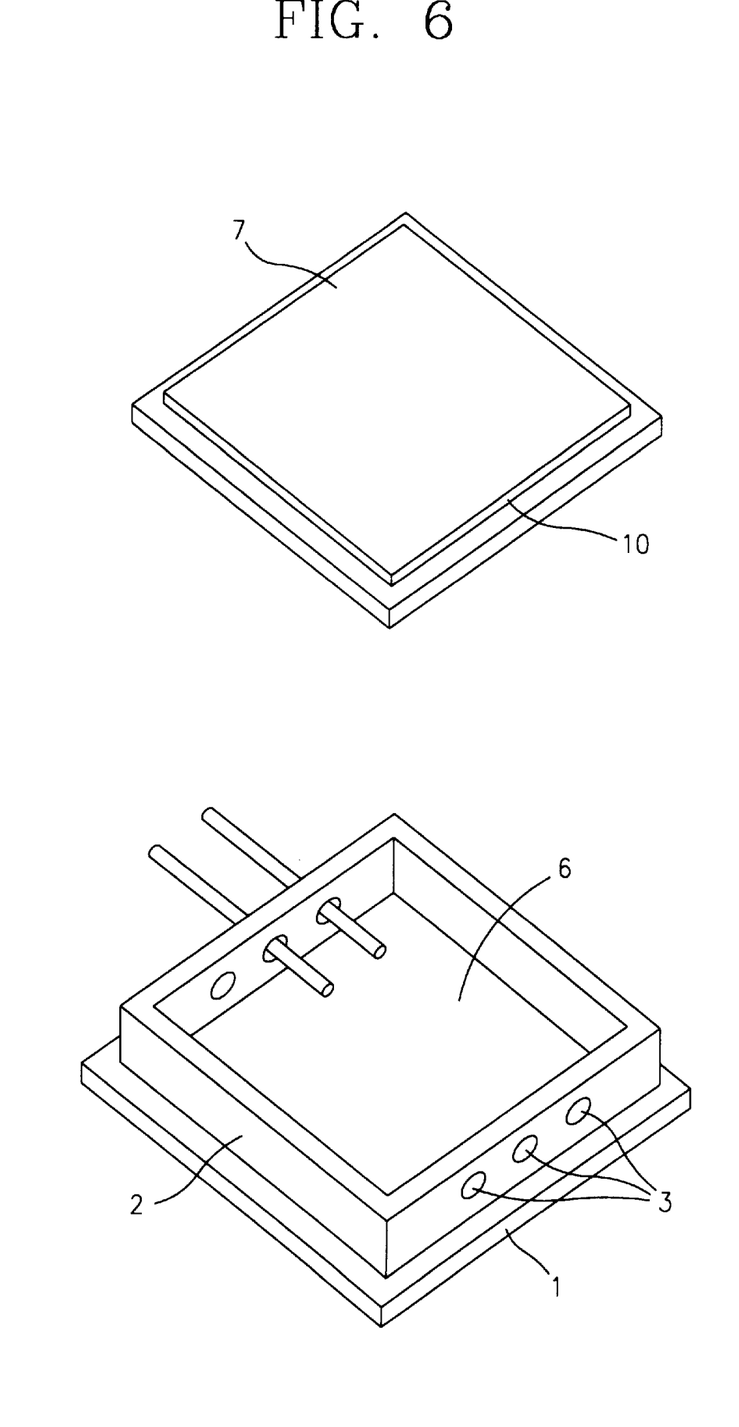
FIG. 6 is a perspective view illustrating still another embodiment of a package body and a container lid for a hermetically sealed tungsten-copper composite package container according to the present invention.

The feedstock fabricated in Example 1 is formed by an injection molding and molded into a shape as shown in FIG. 5, so as to have a porosity of 25%, and a sintering is carried out thereto for 20 hours under a hydrogen atmosphere at a temperature of 1500° C. Then, copper as in Example 1 is infiltrated for 2 hours under a hydrogen atmosphere at a temperature of 1250° C. so as to fabricate a tungsten-copper composite container for a microwave device. Different from Examples 1 and 2, a plurality of via holes 3 are perforated through the side walls 2 for thereby efficiently sealing a microwave device mounted on the inner plate 6, so as not to be influenced by the external environment. Here, an inner lid serving as a slide protect may be additionally provided on a lower surface of the container lid so as to appropriately fix on the container body without undesirable sliding.

As described above, the present invention provides a hermetically sealed tungsten-copper composite package container for a microwave device which incorporates an improved heat sink characteristic, a thermal expansion coefficient similar to that of GaAs, and a capability of applying thereto a strip wire connection, without an extra machining process.

What is claimed is:

1. A hermetically sealed tungsten-copper composite package container for a microwave device, comprising:

a hermetic package body including a base plate, an inner plate provided on the base plate for receiving thereon a microwave device, and a plurality of side walls respectively having a plurality of openings for each passing therethrough an external connection so as to electrically connect the microwave device to an external system, wherein the base plate, the inner plate and the plurality of side walls are incorporated into a single tungsten-copper composite body pattern;

a plurality of first insulating materials formed higher than the inner plate for receiving thereon the microwave device between the inner plate and the respective side walls;

a container lid formed of a tungsten-copper composite material and for covering the package container body; and a plurality of second insulating materials formed extending from a lower surface of the container lid and for being inserted into corresponding ones of the plurality of openings, whereby the microwave device is mounted on the inner plate, the external connection is connected through a corresponding ones of the via holes to the microwave device, and the second insulating materials formed on the container lid are inserted into corresponding ones of the plurality of openings for thereby electrically insulating the external connection from the package body.

2. The package container of claim 1, wherein a slide protect and a recess being engaged to each other are respectively formed on each side of the plurality of second insulating materials and in each of corresponding side walls of the openings.

3. The package container of claim 1 or 2, wherein a second insulation material and the slide protect is formed on a lower surface of the container lid so as to be inserted inside the side walls.

4. The package container of claim 1, wherein the plurality of first insulating materials are respectively formed to have a sufficient height so that the external connection horizontally connects the microwave device to an external system.

5. A hermetically sealed tungsten-copper composite package container for a microwave device, comprising:

a hermetic package body including a base plate, an inner plate formed on the base plate for receiving thereon a microwave device, and a plurality of side walls respectively having a plurality of via holes for each passing therethrough an external connection so as to electrically connect the microwave device to an external system, wherein the base plate, the inner plate and the plurality of side walls are incorporated into a tungsten-copper composite single body pattern;

a plurality of insulating materials for electrically insulating the package body from an external connection that passes through each of the plurality of via holes by filling the respective via holes through each of which passes the external connection; and a container lid formed of a tungsten-copper composite material and for covering the package container body, whereby the microwave device is mounted on the inner plate, and the external connection is connected through a corresponding one of the via holes to the microwave device.

6. The package container of claim 5, wherein an inner lid serving as a slide protect is formed on a lower surface of the container lid so as to be inserted inside the side walls.

7. The package container of claim 5, wherein the plurality of first insulating materials are respectively formed to have a sufficient height so that the external connection horizontally connects the microwave device to an external system.

* * * * *